United States Patent [19]
Bertrand

[11] Patent Number: 4,612,625
[45] Date of Patent: Sep. 16, 1986

[54] DECIMATOR EMPLOYING FINITE IMPULSE RESPONSE DIGITAL FILTERS

[75] Inventor: John Bertrand, Upper Nyack, N.Y.

[73] Assignee: Wavetek Rockland Scientific, Inc., Rockleigh, N.J.

[21] Appl. No.: 541,050

[22] Filed: Oct. 12, 1983

[51] Int. Cl.$^4$ ............................................. G06F 15/31
[52] U.S. Cl. ................................................... 361/724
[58] Field of Search .......................................... 364/724

[56] References Cited

U.S. PATENT DOCUMENTS

| | | | |
|---|---|---|---|
| 4,020,332 | 4/1977 | Crochiere et al. | 364/724 |
| 4,344,149 | 8/1982 | Meeberg et al. | 364/724 |

OTHER PUBLICATIONS

L. R. Rabiner, et al., "Terminology in Digital Signal Processing," Dec. 1972, IEEE Trans. Audio Elecrocoust., v. AU-20 at 322-37.
R. E. Crochiere, et al., "Optimum FIR Digital Filter Implementations for Decimation, Interpolation, and Narrow-Band Filtering," Oct. 1975, IEEE Trans. Acoust., Speech & Signal Proc., v. ASSP-23 at 444-56.
Bede Liu, et al., "Calculation of Narrow-Band Spectra by Direct Decimation," Dec. 1978, IEEE Trans. Acoust., Speech & Signal Proc., v. ASSP-26 at 529-34.
R. E. Crochiere, et al., "Interpolation and Decimation of Digital Signals–A Tutorial Review," Mar. 1981, Proc. IEEE, v. 69 at 300-31.
L. R. Rabiner, et al., *Multirate Digital Signal Processing*, Prentice Hall (1983) at 280-83.
Bellanger et al., "Digital Filtering by Polyphase Network: Application to Sample-Rate Alteration & Filter Banks", *IEEE Trans. on Acoustics, Speech, & Signal Processing*, vol. ASSP-24, No. 2, Apr. 1976, pp. 109-114.
Goodman et al, "Nine Digital Filters for Decimation & Interpolation", *IEEE Trans. on Acoustics, Speech, & Signal Processing*, vol. ASSP-25, No. 2, Apr. 1977, pp. 121-126.

*Primary Examiner*—David H. Malzahn
*Attorney, Agent, or Firm*—Frishauf, Holtz, Goodman & Woodward

[57] ABSTRACT

A decimator of the type having a decimation factor of K, is implemented by a finite impulse response (FIR) filter network of length N. The filter network includes N/K accumulators each of which arithmetically combines samples of an input signal as multiplied by a corresponding set of K network branches, and provides a corresponding output sample. The N/K output samples from the accumulators are provided sequentially at the filter output prior to arrival of the next set of N input signal samples at the filter input.

2 Claims, 3 Drawing Figures

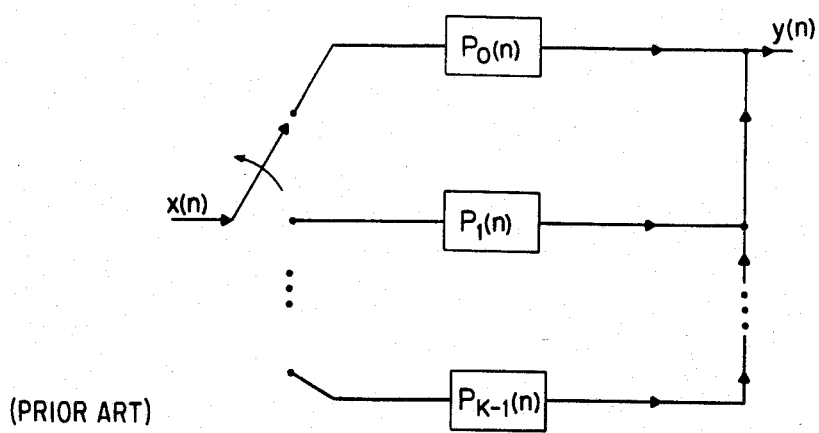
FIG.1 COMMUTATOR MODEL FOR THE K TO 1 POLYPHASE DECIMATOR (PRIOR ART)
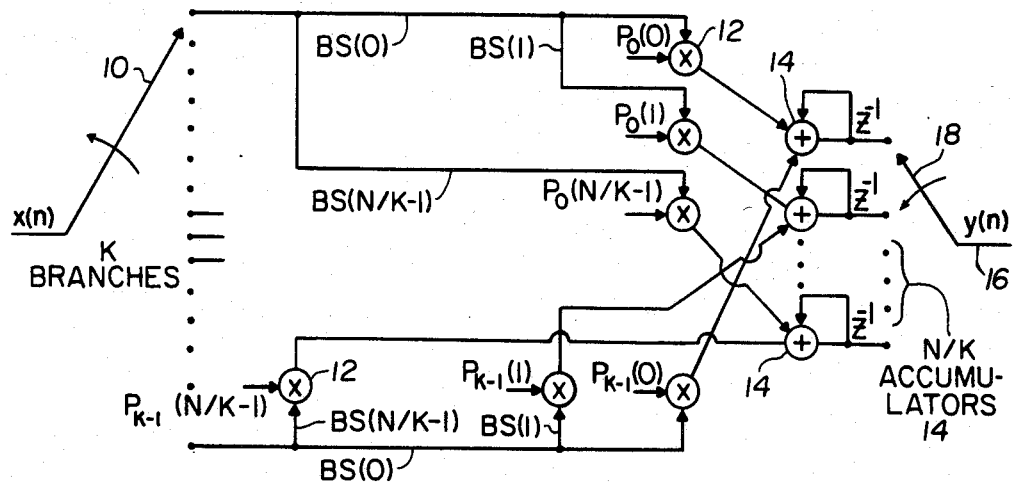
FIG.2 IMPLEMENTATION WITH N/K DELAYS
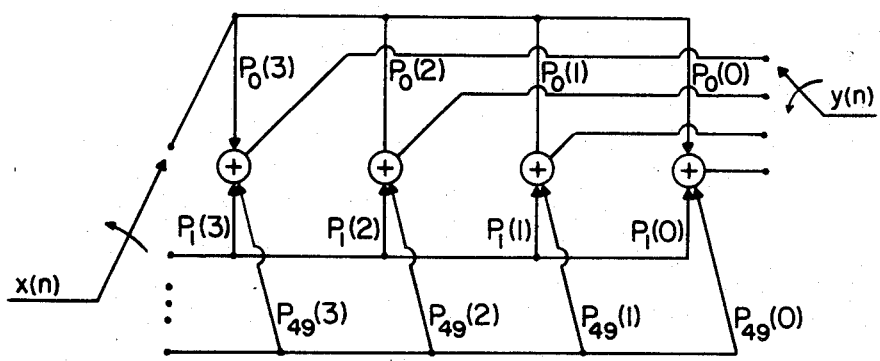
FIG.3 IMPLEMENTATION OF THE LIMITED RANGE DFT BY A POLYPHASE NETWORK

DECIMATOR EMPLOYING FINITE IMPULSE RESPONSE DIGITAL FILTERS

BACKGROUND OF THE INVENTION

1. Field of the Invention

The present invention relates generally to decimators, i.e., electrical circuits operative to reduce by a certain factor the sampling rate of a sampled input signal having a given input sampling frequency. In particular, the invention relates to the implementation of decimators by the use of finite impulse response (FIR) digital filters.

2. Description of the Prior Art

It is known generally that decimators may be implemented by the use of FIR filters. The subject is discussed in several recent publications. For example, see "Optimum FIR Digital Filter Implementations for Decimation, Interpolation, and Narrow-Band Filtering," by R. E. Crochiere, et al., IEEE Trans. Accoustics, Speech, & Signal Processing (vol. ASSP-23, October 1975); "Further Considerations in the Design of Decimators and Interpolators," Id. (vol. ASSP-24, August 1976); and "Interpolation and Decimation of Digital Signals—A Tutorial Review," Proc. IEEE (vol. 69, March 1981). The contents of the foregoing articles are incorporated by reference herein.

A conventional K to 1 decimator, where K is the decimation factor, may be realized by using an FIR filter having a length N where N>K. It will be understood that as an input sample x(n) progresses through the filter, it will be multiplied by N/K different coefficients and will get accumulated N/K times. A simple way to describe the operation is by following a sample through such a filter.

Assume that an output sample was generated and a new input sample x(1) arrives at the input of the filter. Since the filter is used as a decimator, one output is computed for every K input samples. The sample x(1) is, therefore, shifted into a delay line and is not multiplied or accumulated until K cycles later. At that time, the sample x(1) is multiplied by the Kth coefficient, a(K), and accumulated. Another K cycles later, the same sample is multiplied by a(2K) and the process is repeated N/K times, whereupon the sample is shifted out of the filter.

In the conventional N-tap FIR filter-implemented decimator, therefore, the filter requires N memory locations regardless of the decimation factor K. Such memory requirement, together with a controller capable of carrying out the necessary memory addressing, can be quite costly.

It is also possible to use a known polyphase implementation as shown in FIG. 1, which requires K branches with N/K delays each. Such implementation, obviously, does not change the memory requirements or the complexity of addressing the memory.

SUMMARY OF THE INVENTION

An object of the invention is to overcome the above and other shortcomings of the conventional FIR filter-implemented decimators.

Another object of the invention is to provide a decimator which is implemented by an FIR filter having fewer memory locations than the number required in the conventional FIR filter-implemented decimator circuit arrangements.

According to the invention, a decimator of the type having a decimation factor of K and which is implemented by a finite impulse response filter network of length N, includes input commutator means for distributing K samples of an input signal to be decimated in time sequential relation, K circuit branches wherein each circuit branch leads into N/K associated branch sets, each of the circuit branches being coupled at one end to the input commutator means, and including multiplication means in each of the branch sets for providing associated multiplication factors, N/K accumulators each coupled to the outputs of associated ones of said multiplication means for arithmetically combining input samples as multiplied in the N/K branch sets of each of the K circuit branches, and for providing a corresponding output sample, and output commutator means for sequentially providing the output samples obtained from each of the accumulators to a filter output in sufficient time so that N/K output samples corresponding to every set of N input signal samples are provided at the filter output prior to arrival of the next set of N input signal samples at the input commutator means.

The various features of novelty which characterize the invention are pointed out with particularity in the claims annexed to and forming a part of this disclosure. For a better understanding of the invention, its operating advantages and specific objects attained by its use, reference should be had to the accompanying drawings and descriptive matter in which there is illustrated and described a preferred embodiment of the invention.

BRIEF DESCRIPTION OF THE DRAWING

In the drawing:

FIG. 1 is a schematic representation of a decimator implemented by an FIR filter in a conventional manner;

FIG. 2 is a schematic representation of a decimator as implemented generally with an FIR filter according to the present invention; and FIG. 3 is a schematic representation of the decimator of FIG. 2, as arranged to implement a limited range discrete Fourier transform.

DETAILED DESCRIPTION OF THE INVENTION

FIG. 1 shows a decimator implemented by a polyphase FIR filter structure or network, as is already known from, e.g., R. E. Crochiere, et al., "Interpolation and Decimation of Digital Signals—A Tutorial Review," Id. at 310-11. The polyphase network has K branches and each branch is a filter of length N/K. The implementation, therefore, requires N delays and, as explained above, imposes costly memory requirements.

FIG. 2 shows a polyphase network FIR filter implemented decimator according to the invention. The implementation of FIG. 2 includes N/K accumulators each comprising an adder and a delay.

Specifically, the decimator of FIG. 2 includes input commutator means 10 for distributing K samples of a sampled input signal x(n) in time sequential relation to circuit branches within the decimator. Each circuit branch K leads into N/K associated branch sets BS(O)-BS(N/K−1). Each circuit branch K is coupled at one end to input commutator means 10 so that a different input sample x(n) is coupled to each of the K branches leading into the associated N/K branch sets. Each branch among the branch sets includes means 12 for providing an associated multiplication factor $P_k(N/K-n)$, wherein k equals zero to $K-1$, and n equals 1 to N/K.

Each of N/K accumulators 14 is coupled to the outputs of associated multiplication means 12 for arithmetically combining input samples as multiplied in the branch sets associated with each circuit branch K, and for providing a corresponding output sample. As shown in FIG. 2, the accumulators are arranged in a certain sequence ending with a filter output 16 at which an output signal y(n) is provided by the decimator.

Output commutator means 18 steps once whenever the input commutator means 10 completes a cycle through the K branches of each of the branch sets. When the output commutator means 18 steps, each immediately previous delay $Z^{-1}$ that it was pointing to, must be cleared.

The controlling circuitry for the output commutator means 18 therefore must sequentially provide the output samples obtained from each of the accumulators 14 in the direction toward the filter output 16 in sufficient time so that N/K output samples corresponding to every set of N input signal samples are provided at the filter output 16, prior to arrival of the next set of N input signal samples at the input means 10.

The arrangement of FIG. 2 thus requires only N/K delays or memory locations; however, N/K branch multiplications and accumulations must be performed between the arrivals of each set of N input signal samples. The arithmetic unit speed or time requirement to carry out the necessary branch multiplications and accumulations is $$(N/K)^* t_{MAC} \leq 1/FS$$

where
N = filter length,
K = decimation factor,
$t_{MAC}$ = multiplication/accumulation time, and
FS = input sampling frequency.

In order to provide an understanding of the nature of the hardware necessary to implement a decimator according to the invention, and without limitation on the various possible applications thereof, the following example is given with reference to FIG. 3.

FIG. 3 represents one of two identical FIR filters each of length 200 used to decimate by a factor of 50. The filter was designed to implement a limited range discrete Fourier transform (DFT), and complex coefficients are provided wherein one filter as shown in FIG. 3 computes the real part and the other, identical filter computes the imaginary part of the output.

In this case, $$N/K = 4.$$

Thus the total memory requirement is 4 complex words, rather than 200 real. Assume, for example, a sampling frequency of 256 kHz, corresponding to an analysis range of 100 kHz, is used. For this sampling rate, the necessary speed of the Arithmetic Unit is given by $$t_{MAX} \leq (\tfrac{1}{4})^*(1.256000) \approx 1 \text{ us}.$$

Since the coefficients are complex, it follows that each multiplication and accumulation must be performed in less than 500 nanoseconds. Such requirement can easily be met by either the monolithic multipliers of TRW and AMD or even by discrete MSI ALU chips (e.g., 74381).

It should also be mentioned that the Data Memory addressing operation involves addressing of only 8 accumulators which can be simply performed with a 3-bit counter that cycles through eight counts for every input sample. A "divide by 50" counter generates a pulse for every 50 input samples. This causes the generation of the output samples and the clearing of the corresponding accumulators. The 3-bit counter is also advanced at this point so that it now points to the next pair of accumulators as the source of the next output. If the filter was implemented in the conventional manner, the data would have to be shifted through memory. Alternatively, a pointer would have to be created to keep track of the starting point of the filter. Both are nontrivial and time consuming operations.

It is further noted that the limited range DFT is used to increase the resolution of spectrum analysis. Such resolution is increased by increasing the decimation factor which can be achieved by increasing the length of the decimation filter. As is apparent with the present FIR filter arrangement, if the ratio N/K can be held constant, an increase in resolution imposes no additional speed requirements, as might be expected when dealing with a decimator, but no additional data memory requirements are imposed. The only requirement for higher resolution, apart from a decrease in range is the additional memory required to store the branch coefficients of the decimating filter.

While specific embodiments of the invention have been shown and described in detail to illustrate the application of the inventive principles, it will be understood that the invention may be embodied otherwise without departing from such principles.

I claim:

1. A decimator of the type implemented by a finite impulse response filter network of length N, the decimator having a decimation factor of K, comprising:
    input commutator means for distributing K samples of an input signal to be decimated in time sequential relation, wherein $N > K$;
    K circuit branches wherein each circuit branch leads into N/K associated branch sets, each of said circuit branches being coupled at one end to said input commutator means, and including multiplication means in each of said branch sets for providing associated multiplication factors;
    N/K accumulators each coupled to the outputs of associated ones of said multiplication means, for arithmetically combining input samples as multiplied in said N/K branch sets of each of said K circuit branches, and for providing a corresponding output sample; and
    output commutator means coupled to said N/K accumulators for sequentially providing the output samples obtained from each of said accumulators to a filter output in sufficient time so that N/K output samples corresponding to every set of N input signal samples are provided at the filter output prior to arrival of the next set of N input signal samples at said commutator means.

2. A decimator according to claim 1, wherein each of said accumulators comprises an adder and a delay.

* * * * *

UNITED STATES PATENT AND TRADEMARK OFFICE
CERTIFICATE OF CORRECTION

PATENT NO. : 4,612,625
DATED : September 16, 1986
INVENTOR(S) : John BERTRAND

It is certified that error appears in the above-identified patent and that said Letters Patent is hereby corrected as shown below:

COLUMN 3, equation on line 61, should read $$--t_{MAC} \leq (\tfrac{1}{4}) * (1/256000) \cong 1 \text{ us.}--.$$

Signed and Sealed this

Twenty-seventh Day of January, 1987

Attest:

DONALD J. QUIGG

Attesting Officer     Commissioner of Patents and Trademarks